United States Patent [19]

Watanabe et al.

[11] Patent Number: 4,841,265
[45] Date of Patent: Jun. 20, 1989

[54] SURFACE ACOUSTIC WAVE FILTER

[75] Inventors: Takaya Watanabe; Shigeo Fushimi, both of Tokyo, Japan

[73] Assignee: NEC Corporation, Tokyo, Japan

[21] Appl. No.: 249,024

[22] Filed: Sep. 26, 1988

[51] Int. Cl.$^4$ ........................ H03H 9/145; H03H 9/64
[52] U.S. Cl. .................................... 333/194; 333/195; 333/196
[58] Field of Search ............... 333/193, 194, 195, 196, 333/150-155; 310/313 R, 313 A, 313 B, 313 C, 313 D

[56] References Cited

U.S. PATENT DOCUMENTS 4,464,597  8/1984  Setsune ........................... 310/313 B
4,600,852  7/1986  Garber ............................ 310/313 B

OTHER PUBLICATIONS

"Acoustic Surface-Wave Bandpass Filters", Philips Technical Review, vol. 36, 1976, No. 2, D. W. Parker et al., pp. 529–533.
"Surface Wave Filters", Design, Construction, and Use, Herbert Matthews, pp. 132–135, New York, 1977.
"Theory and Design of the Survace Acoustic Wave Multistrip Coupler", IEEE Transactions on Microwave Theory & Techniques, vol. MTT-21, No. 4, Apr. 1973, F. Graham Marshall et al.; pp. 206–215.

Primary Examiner—Marvin L. Nussbaum
Attorney, Agent, or Firm—Sughrue, Mion, Zinn, Macpeak & Seas

[57] ABSTRACT

A surface acoustic wave (SAW) filter has a piezoelectric substrate and a conductive transducer formed over the substrate. The transducer has first and second bus bars arranged in parallel at a prescribed interval from each other, a plurality of pairs of first electrode fingers having the same lengths, and a plurality of pairs of second electrode fingers having the same lengths. The tips of the second electrode fingers are positioned opposite those of the first electrode fingers. The transducer also has first and second weighted electrode pairs positioned between two adjacent pairs of the first electrode fingers and two adjacent pairs of the second electrode fingers, respectively. Each pair of first weighted electrodes has a pair of first electrode sections whose lengths of overlap with the paired second electrode fingers are determined by the negative tap coefficients of an FIR filter having a desired low pass characteristic and a pair of second electrode sections positioned on the elongations of these first electrode sections, one end of each such second electrode section been connected to the first bus bar. The second weighted electrode pairs are similarly formed, but the lengths of overlap are determined by the positive tap coefficients of the FIR filter.

14 Claims, 7 Drawing Sheets

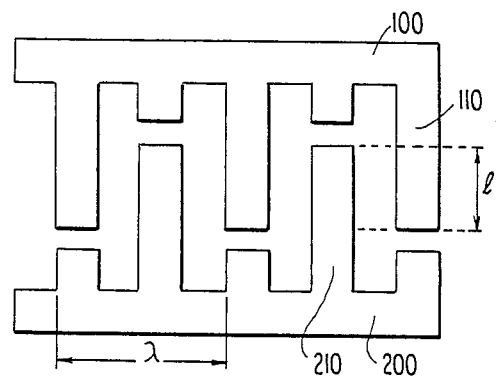
FIG.1A
PRIOR ART
FIG.1B
PRIOR ART
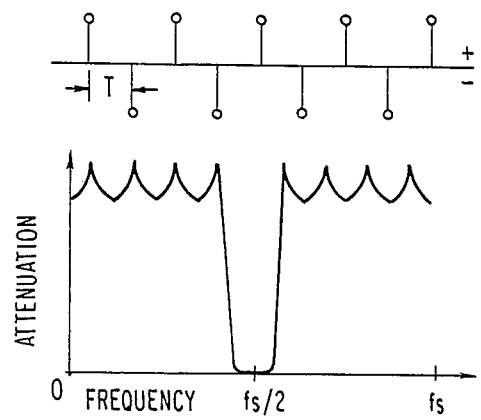
FIG.2
PRIOR ART
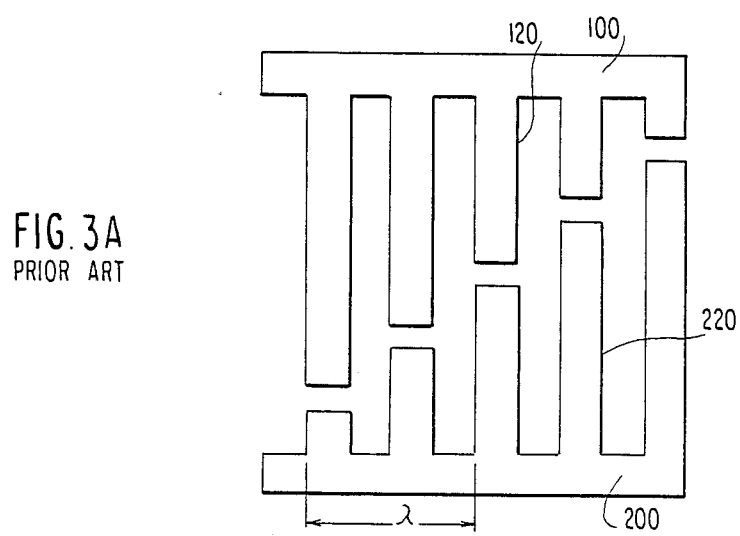
FIG.3A
PRIOR ART
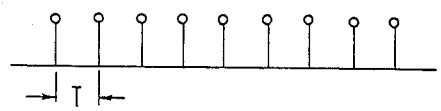
FIG.3B
PRIOR ART

SURFACE ACOUSTIC WAVE FILTER

BACKGROUND OF THE INVENTION

The present invention relates to surface acoustic wave (SAW) devices, and more particularly to a surface acoustic wave lowpass filter.

A SAW filter generally, has a substrate made of piezoelectric material capable of generating a surface acoustic wave, a transducer, formed on the substrate, having an electrode pattern to energize the surface wave, and a transducer to receive the energized surface wave. In order to achieve an excellent filter characteristic, at least one of the transducers is usually composed in an apodized electrode pattern. The configuration of the apodized electrode pattern is determined by the impulse response of a finite impulse response (FIR) filter having the filter response. The impulse response is assessed to determine the amount of overlap between the electrode fingers of the apodized transducer. The amount of overlap between the fingers is proportional to the sampling values (tap coefficients) of the impulse response of the FIR filter. The tap coefficients of the FIR filter are also known as weighted coefficients of the SAW filter. As high-frequency electric signals are applied to the transducer having the apodized electrode pattern, a surface acoustic wave is excited, an impulse response is obtained from the other transducer as its output, and thereby the input-output response presents the frequency characteristic of the FIR filter.

Although the aforementioned type of apodized transducer is used in bandpass filters as described in D. W. Parker et al., "Acoustic surface-wave bandpass filters", Philips Technical Review, 1976, volume 36, No. 2, pp. 29–43, its use in lowpass filters has not yet been studied well. In a system for transmitting audio and video signals, a lowpass filter having a steep frequency characteristic in the video pass band of 4 to 5 MHz is usually required to separate video signals, and accordingly realization of a SAW lowpass filter giving a comparatively steep filter characteristic is hoped for.

SUMMARY OF THE INVENTION

An object of the present invention is to provide a SAW lowpass filter which permits size reduction by minimizing the lengths of electrode fingers which determine the filter characteristic.

Another object of the invention is to provide a SAW filter wherein a transducer capable of achieving the lowpass filter characteristic and the bandpass filter characteristic is formed over a single piezoelectric substrate.

A surface acoustic wave (SAW) filter according to the invention has a piezoelectric substrate and a conductive transducer formed over the piezoelectric substrate.

The transducer comprises first and second bus bars arranged in parallel at a prescribed interval from each other; a plurality of pairs of first electrode fingers having the same lengths, vertically extending from the first bus bar and arranged at prescribed intervals in the lengthwise direction of the first bus bar; and a plurality of pairs of second electrode fingers having the same lengths, vertically extending from the second bus bar, arranged at the prescribed intervals in the lengthwise direction of the second bus bar. The tips of these paired second electrode fingers are positioned opposite to those of the paired first electrode fingers. The transducer further comprises a plurality of first weighted electrode pairs positioned between two adjacent pairs of the paired first electrode fingers, each pair of the first weighted electrodes having a pair of first electrode sections whose lengths of overlap with the paired second electrode fingers are determined by the negative tap coefficients of an FIR filter having a desired lowpass characteristic and a pair of second electrode sections positioned on the elongations of these first electrode sections, one end of each such second electrode section being connected to the first bus bar; and a plurality of second weighted electrode pairs positioned between two adjacent pairs of the paired second electrode fingers, each pair comprising a pair of third electrode sections positioned between two opposite first electrode pairs, whose lengths of overlap with said paired first electrodes are determined by the positive tap coefficients of the FIR filter, and a pair of fourth electrode sections positioned on the elongations of said electrode sections, one end of each such fourth electrode section being connected to the second bus bar.

The invention further provides a surface acoustic wave (SAW) filter, wherein the first and second electrode sections of each pair of the first weighted electrodes are apart from each other at a prescribed interval, and the third and fourth electrode sections of each pair of the second weighted electrodes are also apart from each other at the same distance.

In still another surface acoustic wave (SAW) filter according to the invention, the transducer comprises a first transducer, second and third transducers arranged in parallel to each other, and a multistrip coupler coupling the first transducer to the second and third transducers, wherein a lowpass filter and a bandpass filter are realized together, the former with the first and second transducers and the multistrip coupler, and the latter with the first and third transducers and the multistrip coupler.

BRIEF DESCRIPTION OF THE DRAWINGS

The present invention will be better understood from the following detailed description taken in conjunction with the accompanying drawings in which:

FIG. 1A shows a plan of a transducer in a SAW bandpass filter by the prior art;

FIG. 1B shows the weighted coefficients of the transducer of FIG. 1A;

FIG. 2 shows the frequency responses of a SAW filter having the transducer of FIG. 1A;

FIG. 3A shows a plan of a transducer in a SAW lowpass filter by the prior art;

FIG. 3B shows the weighted coefficients of the transducer of FIG. 3A;

DETAILED DESCRIPTION OF THE PREFERRED EMBODIMENTS

Figure 4A:
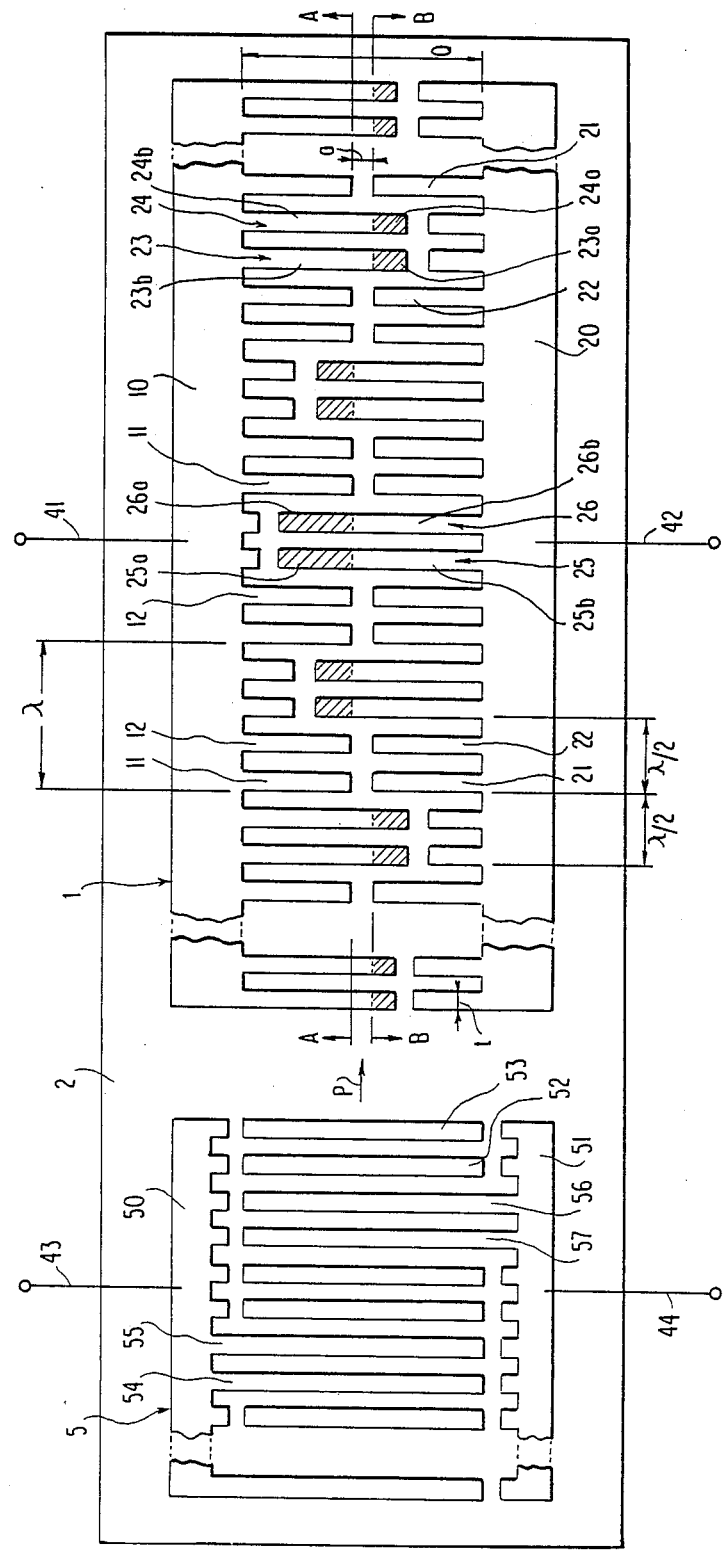
FIG. 4A shows a plan of a first preferred embodiment of the present invention.

Now, in order to facilitate understanding of the preferred embodiments of the present invention, a SAW filter by the prior art will be described first.

FIG. 1A shows a plan of a transducer in a SAW bandpass filter by the prior art. Referring to the figure, bus bars 100 and 200 are formed over a piezoelectric substrate (not shown) in parallel to each other, and electrode fingers 110 and 210, whose amounts of overlap are determined by the tap coefficients of an FIR filter, vertically extend from the respective bus bars. In the arrangement of FIG. 1A, the amounts of overlap 1 of all the fingers of the transducer are supposed to be equal. FIG. 2 shows the frequency responses of the SAW filter of FIG. 1A. The wavelength λ of the surface acoustic wave excited over the piezoelectric substrate is represented by $$\lambda = 2v/f_s = 2vT \quad \text{(T is the sampling period)}$$

where $f_s$ is the sampling frequency of the FIR filter and v, the phase velocity of the surface acoustic wave. The pitch t (the sum of the width of an electrode finger and the interval between electrode fingers) of the electrode fingers of the transducer for exciting the surface acoustic have at the wavelength is represented by $$t = \lambda/2$$

so that the widths of the fingers 110 and 210 and the interval between them are prescribed to be $\lambda/4$ (=t/2) each. Where the SAW filter is a bandpass filter, the center frequency of the pass band is $f_s/2$. As the tap coefficients of a bandpass type FIR filter alternate plus and minus signs sample by sample, the weighted coefficients of the transducer of FIG. 1A can be represented as shown in FIG. 1B. Where the tap coefficients of the FIR filter alternately reverse their sign, a finger 210 overlaps a finger 110, and then the finger 110 overlaps next finger 210, this sequence being periodically repeated thereafter, so that the fingers 110 and 210 need not be very long even if the tap coefficients have large values.

In a lowpass type FIR filter, however, the sign of the tap coefficients is not reversed sample by sample as shown in FIG. 3B, so that the same sign is repeated for a prescribed period of time. Therefore in the transducer of a lowpass type SAW filter, as shown in FIG. 3A, an electrode finger 220 extending from the bus bar 200 overlaps an electrode 120 extending from the bus bar 100, then the next finger 220 again overlaps the next finger 120 and so forth, resulting in greater lengths of electrode fingers. In fact, the tap coefficients of a lowpass type FIR filter show relatively large values consecutively and, moreover, the number of coefficients runs up to hundreds, so that the electrode fingers of the SAW filter are required to be extremely long which makes such a filter impossible to realize.

A lowpass type SAW filter according to the present invention has transducers whose electrode fingers are prevented from becoming unduly long.

FIG. 4A shows a plan of a SAW lowpass filter, which is a first preferred embodiment of the present invention.

Referring to FIG. 4A, electrode transducers 1 and 5 are formed by the sputtering technique over a piezoelectric substrate of quartz, $LiNbO_3$, $LiTaO_3$ or the like. The transducer 1, having an apodized electrode configuration, includes first and second bus bars 10 and 20 arranged in parallel to each other, and a plurality of electrode fingers extending from each bus bar. The transducer 1 has a double electrode structure, in which a pair of electrode fingers of the same lengths are arranged in parallel at $\lambda/2$ ($\lambda = 2v/f_s$, where v is the phase velocity of the surface acoustic wave, and $f_s$, the sampling frequency of an FIR filter equivalent to the SAW filter of FIG. 4A) intervals. The width of each finger and the interval between electrode fingers are equally $\lambda/8$ each, ½ as great as those of the SAW lowpass filter shown in FIG. 3A. The transducer 5 is a normalized electrode pattern arranged in series apart from the transducer 1. As input electric signals are fed to the transducer 5 from input lines 43 and 44, the acoustic wave excited by the transducer 5 moves in the direction of arrow P, and is received by the transducer 1 to provide on output lines 41 and 42 response signals determined by convolutive integration by the transducers 5 and 1. As the transducer 5 is a normal red electrode pattern whose impulse response is 1, the characteristic of the SAW lowpass filter of FIG. 4A is determined by the configuration of the transducer 1.

Next will be described in detail the electrode structure of the transducer 1. A plurality of pairs of first electrode fingers 11 and 12 vertically extending from the first bus bar 10 are all equal in length, and periodically arranged in the lengthwise direction of the bus bar 10 at intervals of wavelength λ. Meanwhile a plurality of pairs of second electrode fingers 21 and 22, vertically extending from the second bus bar 20 are formed on the elongations of the paired first electrode fingers 11 and 12, respectively, and arranged in the lengthwise direction of the bus bar 20 at intervals of wavelength λ. The distance between the corresponding tips of the paired second electrode fingers 21 and 22 and of the paired first electrode fingers 11 and 22 is a. Although the paired electrode fingers 21 and 22 and the paired electrode fingers 11 and 12 are equal in length in FIG. 4A, they need not be equally long. Each of plural pairs of first weighted electrodes 23 and 24 is arranged between pairs of electrode fingers 11 and 12, and each of plural pairs of second weighted electrodes 25 and 26, between pairs of electrode fingers 21 and 22. The lengths of these weighted electrodes are determined as will be explained below.

Each pair of weighted electrodes 23 and 24 respectively have first electrode sections 23a and 24a (shaded parts below line BB) overlapping the electrode fingers 21 and 22, and second electrode sections 23b and 24b (parts other than the shaded ones) reaching the bus bar 10 from the first electrode sections. The lengths of the first electrode sections 23a and 24a correspond to the values of the negative coefficients of the FIR filter having a desired lowpass characteristic.

Each pair of second weighted electrodes 25 and 26 respectively have third electrode sections 25a and 26a (shaded parts above line AA) overlapping the electrode fingers 11 and 12, and fourth electrode sections 25b and 26b (parts other than the shaded ones) reaching the bus bar 20 from the third electrode sections. The length of the third electrode sections 25a and 26a correspond to the values of the positive coefficients of the FIR filter having the desired lowpass characteristic.

Therefore, in the transducer 1, the parts of the electrode fingers above line AA are weighted according to the positive tap coefficients of the FIR filter, and the electrode sections below line BB are weighted according to the negative tap coefficients of the FIR filter. On the elongations of the weighted electrode pairs 23/24 and 25/26 are formed dummy electrode pairs connected to the bus bars 10 and 20, respectively.

Meanwhile, the transducer 5 includes bus bars 50 and 51 which are parallel to each other and a plurality of electrode fingers having equal widths to the electrode fingers of the transducer 1 and formed at equal intervals. Pairs of floating electrodes 52 and 53 are periodically arranged along the lengthwise direction of the bus bars 50 and 51 at $\lambda$ ($\lambda$ is the wavelength of the surface acoustic wave) intervals. The length of the paired floating electrode is equal to width Q of the electrode finger parts of the transducer 1. Between pairs of the floating electrodes 52 and 53 are alternately arranged pairs of electrode fingers 54 and 55 connected to the bus bar 50 and pairs of electrode fingers 56 and 57 connected to the bus bar 51. Opposite to the two ends of the paired electrodes 52 and 53 are formed short electrode fingers connected to the bus bar 50 or 51 at prescribed intervals.

As the length of the paired floating electrodes 52 and 53 is equal to width Q of the electrode finger parts of the transducer 1, a surface wave excited by the transducer 5 can be efficiently received by the transducer 1.

Figure 4B:
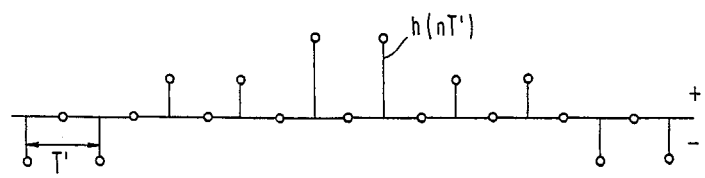
FIG. 4B shows the weighted coefficients of the transducer of the SAW filter of FIG. 4A.
Figure 4C:
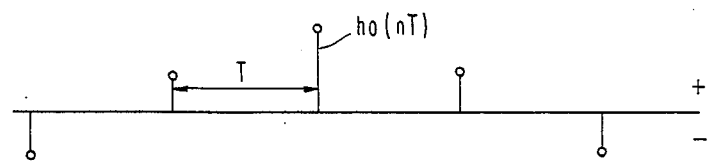
FIG. 4C shows the impulse responses of the desired lowpass type FIR filter.

FIG. 4B illustrates the weighted coefficients of the transducer 1 of the SAW filter of FIG. 4A. Referring to FIG. 4A, as the paired electrode fingers arranged at $\lambda/2$ intervals are equal in length, zero coefficients are inserted between coefficients of the same values. FIG. 4C shows the impulse responses of the desired lowpass type FIR filter to determine the lengths of the first electrode sections 23a and 24a and of the third electrode sections 25a and 26a. In this embodiment, the sampling frequency is made double that of the desired lowpass type FIR filter by an operation known as zero-order hold. Hereupon, the effect of the zero-order hold on the filter characteristic will be explained.

$$T' = 1/2f_s \text{ and } T = 2T'$$

where $f_s$ is the sampling frequency of the desired lowpass type FIR filter; T, its period; and T', its sampling period after zero-order hold.

$$h((2n+1)T') = h(2nT'), n = 9, 1, \ldots, N-1 \quad (1)$$

$$h(2nT') = h_0(nT), n = 0, 1, \ldots, N-1 \quad (2)$$

where N is the number of coefficients of the desired lowpass type FIR filter; $h_0(nT)$, the value of the coefficient; and $h(nT')$, the coefficient value of tee FIR filter after zero order hold. Then, to bring in w representing the angular frequency, and z, a complex variable:

$$z = \text{expo}(jwT')$$

Subjecting $h(nT')$ to z transformation gives:

$$H(z) = \sum_{n=0}^{N-1} h(2nT') z^{-2n} + h(2n+1)T' z^{-2n-1} \quad (3)$$

Substituting equation (1) into equation (3) gives:

$$H(z) = (1 + z^{-1}) \sum_{n=0}^{N-1} h(2nT') z^{-2n} \quad (4)$$

Substituting equation (2) into equation (4) gives:

$$H(z) = (1 + z^{-1}) \sum_{n=0}^{N-1} h_0(nT) z^{-2n}$$

Accordingly, $$H(z) = (1 + z^{-1}) H_0(z) \quad (5)$$

where $H_0(z)$ is the transfer function of a usual lowpass type FIR filter.

Equation (5) indicates that an FIR filter after zero order hold has a deviation of characteristic by $(1 + z^{-1})$. However, since a SAW filter has a high sampling frequency $f_s$ (usually tens of MHz or above), a virtually equal characteristic to that of the desired lowpass type FIR filter can be achieved with this preferred embodiment.

Figure 5:
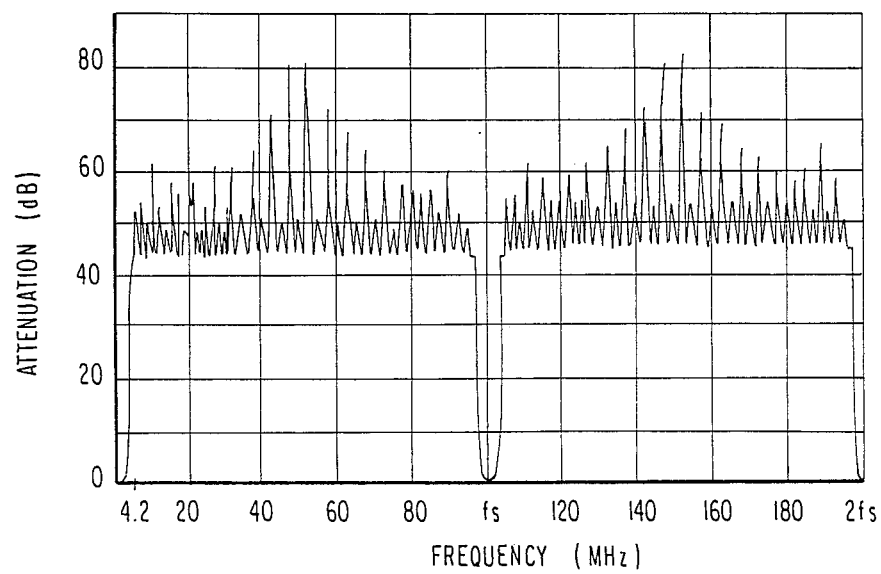
FIG. 5 shows the frequency responses of the SAW filter of FIG. 4A.

FIG. 5 shows the frequency responses of the SAW filter of FIG. 4A, designed by the use of the tap coefficients of a lowpass type FIR filter having a sampling frequency $f_s$ 100 MHz and a pass band end frequency of 4.2 MHz. In the figure, pass bands emerge at $f_s$ intervals.

Figure 6:
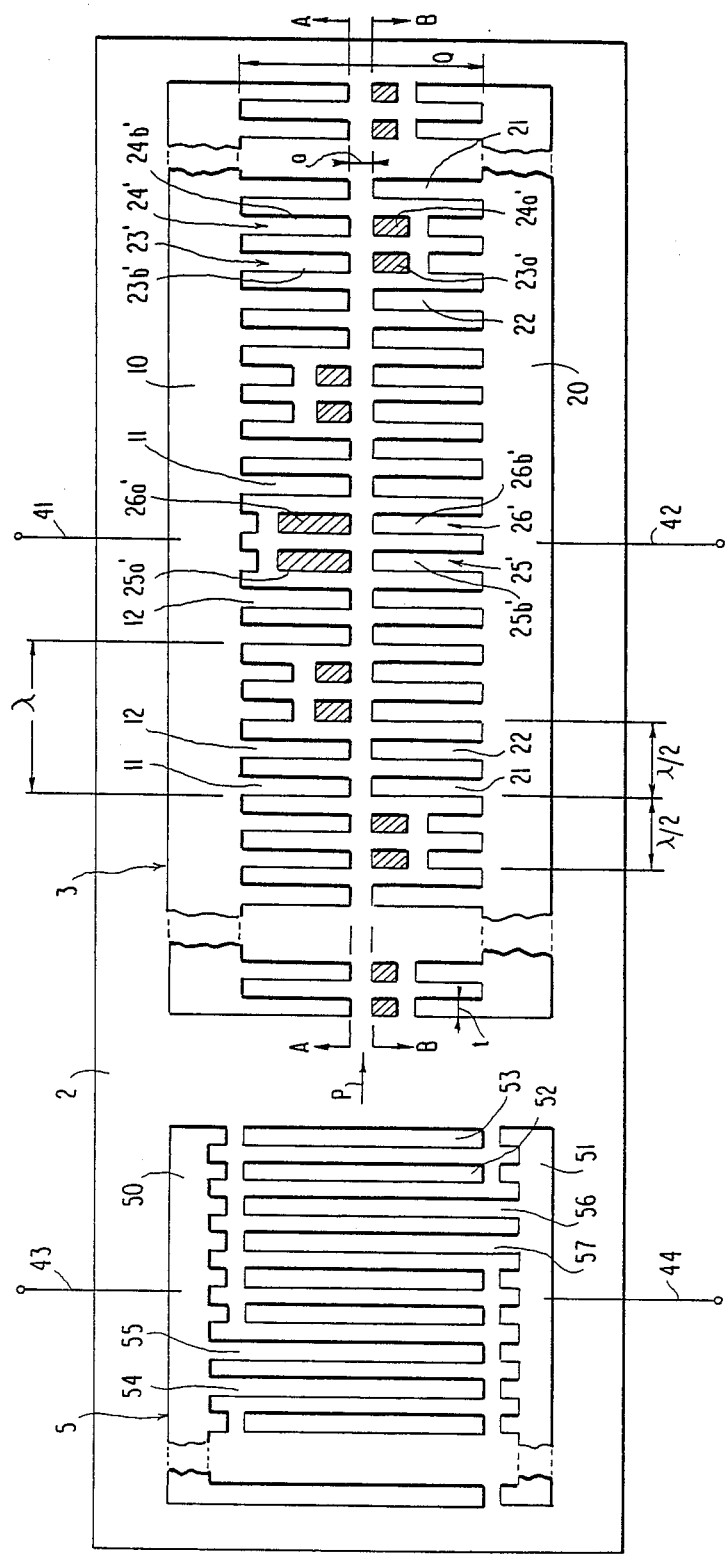
FIG. 6 shows a plan of a second preferred embodiment of the invention.

FIG. 6 is a block diagram illustrating a second preferred embodiment of the present invention. In the figure, a transducer 3 differs from the transducer 1 of the SAW filter of FIG. 4A in that first electrode sections 23a' and 24a' of paired first weighted electrodes 23' and 24' are apart by a from second electrode sections 23b' and 24b' of same, respectively, and so are third electrode sections 25a' and 26a' of paired second weighted electrodes 25' and 26' from fourth electrode sections 25b' and 26b' of same. Thus, the first electrode sections 23a' and 24a' and the third electrode sections 25a' and 26a' constitute floating electrodes. The second electrode sections 23b' and 24b' are equal in length to the paired electrode fingers 11 and 12, and the fourth electrode sections 25b' and 26b' are equal in length to the paired electrode fingers 21 and 22. As the electrode sections 23a' and 24a' are equal in length to the electrode sections 23a and 24a of FIG. 4A, the electrode sections 25a' and 26a' are equal in length to the electrode sections 25a and 26a of FIG. 4A and, moreover, the electrode sections 23a' and 24a' and the electrode sections 25a' and 26a' generate electric charges different from the electrode fingers respectively beside them, the SAW lowpass filter of FIG. 6 is equivalent to and has the same characteristics as the SAW filter of FIG. 4A.

Figure 7:
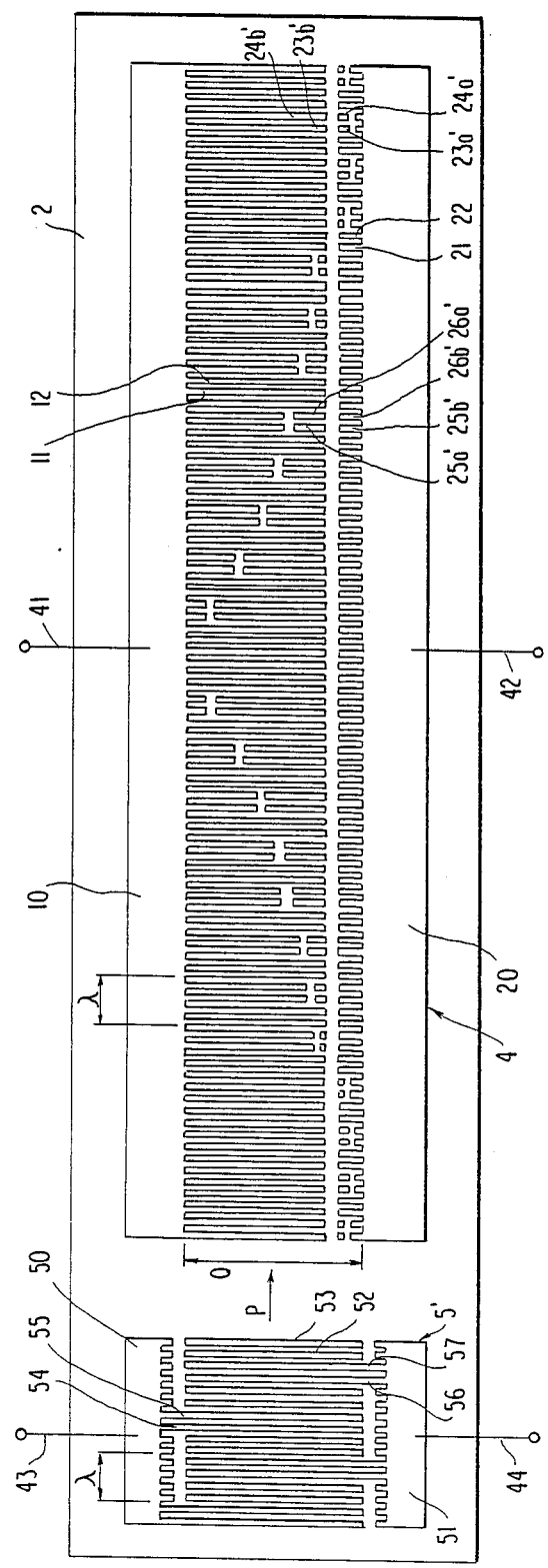
FIG. 7 shows a plan of a third preferred embodiment of the invention.

FIG. 7 shows a plan of a third preferred embodiment of the present invention. Referring to the diagram, transducers 4 and 5', having a conductor pattern formed in series on the piezoelectric substrate 2, are electrodes for transmission and reception, respectively. The transducer 4 has the electrode pattern of a SAW lowpass filter composed by the same designing method as for the transducer 3 of the SAW filter shown in FIG. 6, and though its configuration differs from that of the transducer 3, its electrodes denoted by the same reference numerals as those assigned to the electrodes of the transducer 3 respectively correspond to those of the transducer 3. The same is true with the reference numerals assigned to the electrodes of the transducer 5', which constitutes a normalized electrode pattern for obtaining a full-band filter (whose impulse response is equal to 1). As electric signals are applied to the input lines 43 and 44 connected to the transducer 5', the surface acoustic wave excited by the transducer 5' moves in the direction of arrow P, and is received by the transducer 4 to provide on the output lines 41 and 42 response signals determined by convolutive integration by the filtering functions of transducers 4 and 5. Thus there are obtained on the output lines 41 and 42 lowpass signals determined by the lowpass filter characteristics of the transducer 4.

Incidentally, although the transducers 5 and 4 are used for transmission and reception, respectively, in FIG. 7, their functions can as well be interchanged to achieve the same characteristics.

Figure 8:
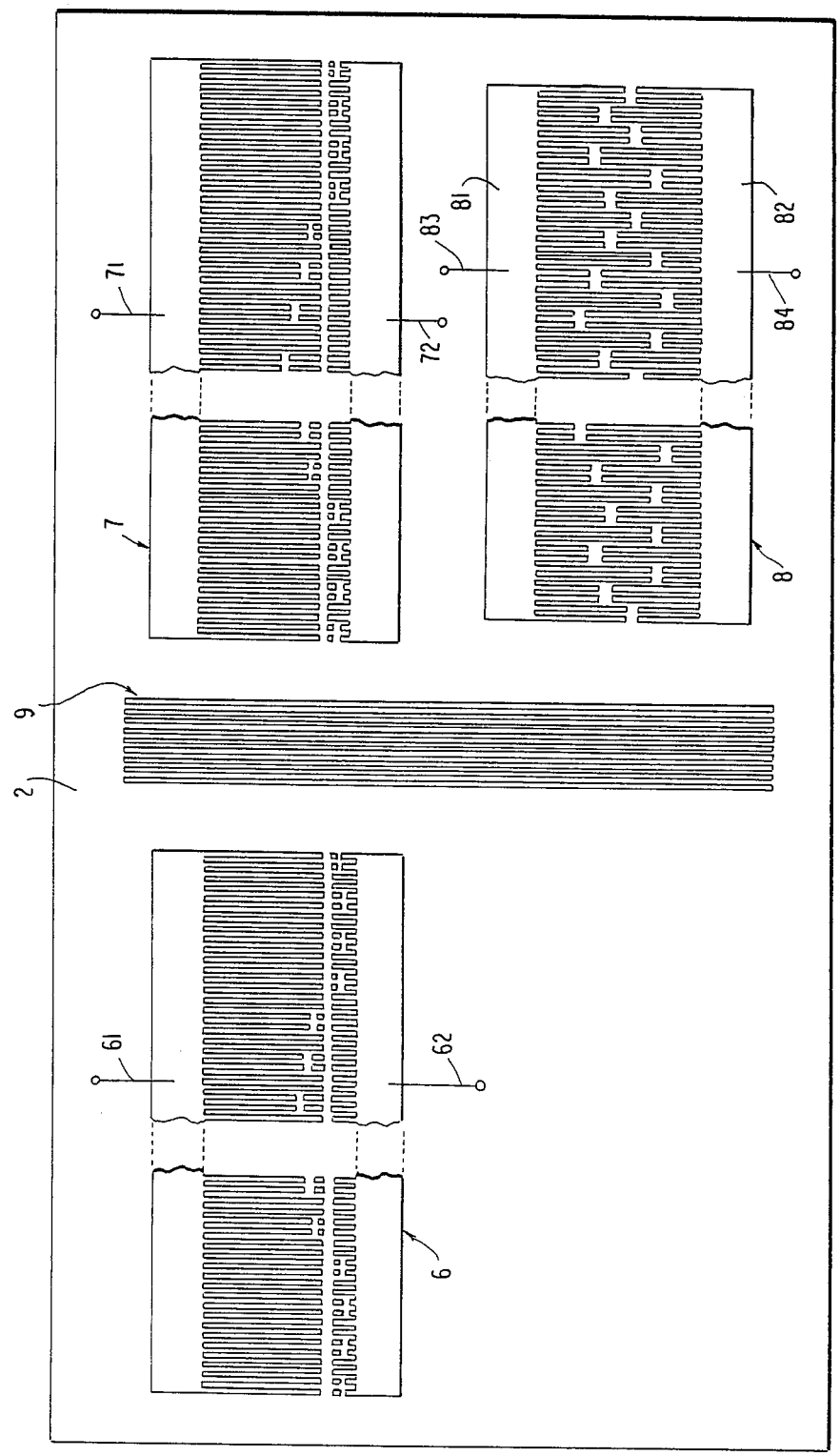
FIG. 8 shows a plan of a fourth preferred embodiment of the invention.

FIG. 8 shows a plan of a fourth preferred embodiment of the present invention.

Referring to the figure, an electrode pattern to realize a SAW filter having the characteristics of both a lowpass filter and a bandpass filter is formed over the surface of the piezoelectric substrate 2. The electrode pattern consists of an input side transducer 6, output side transducers 7 and 8, and a multistrip coupler 9 arranged between the input and output side transducers.

The transducer 6 has the same electrode pattern as the transducer 4 illustrated in FIG. 7, and is weighted according to the tap coefficients of a lowpass FIR filter. The transducer 7 has the same electrode pattern as the transducer 6. The transducer 8 has a pattern of double electrode composition, weighted according to the tap coefficients of a bandpass FIR filter. Thus pairs of electrode fingers vertically extending from a bus bar 81 and pairs of electrode fingers vertically extending from a bus bar 82 alternately overlap each other, and their overlap length is proportional to the tap coefficient of the bandpass FIR filter. The width of each electrode finger and the interval between electrode fingers are the same as those in the input side transducer 6 so that this transducer 8 be compatible with the transducer 6. A structure in which a plurality of transducers are coupled by a multistrip coupler is described in F. Graham et al., "Theory and Design of the Surface Acoustic Wave Multistrip Coupler", IEEE Transactions on Microwave Theory and Techniques, vol. MTT-21, No. 4, pp. 206-215, April 1973, and H. Matthews, "Surface Wave Filters", pp. 132-135, 1977. According to these two references, the input-output responses of a SAW filter in which input and output side transducers are coupled by a multistrip coupler have frequency characteristics determined by the configuration of the output side transducer. Therefore, when electric signals are fed to the transducer 6 from input lines 61 and 62 to generate a surface acoustic wave on the piezoelectric substrate 2, the surface wave reaches the transducers 7 and 8 via the coupler 9, and the transducers weighted coefficients of their respective electrode patterns. Therefore, output signals of a lowpass filter are obtained from output lines 71 and 72 of the transducer 7, while output signals of a bandpass filter are obtained from output lines 83 and 84 of the transducer 8.

Figure 9:
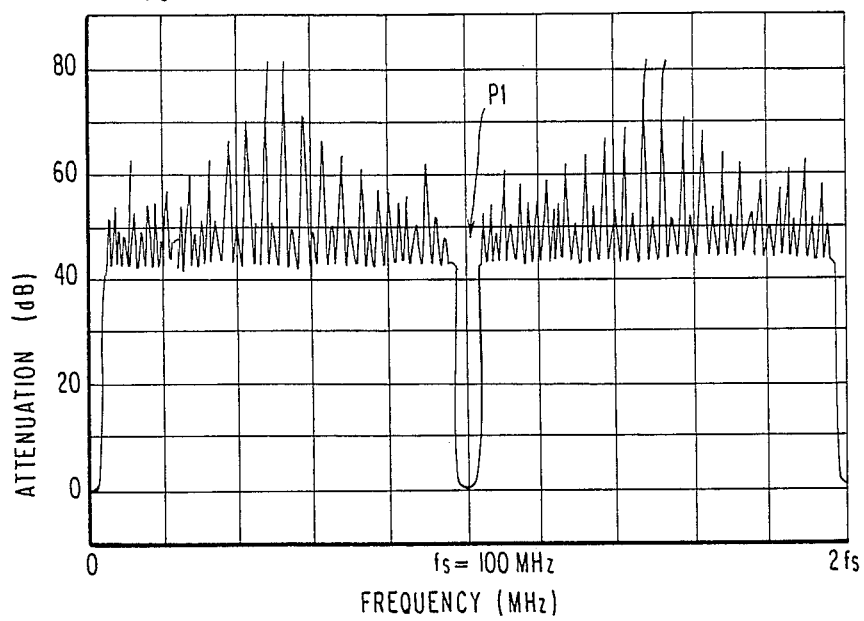
FIGS. 9 and 10 show the frequency responses of the SAW filter of FIG. 8.
Figure 10:
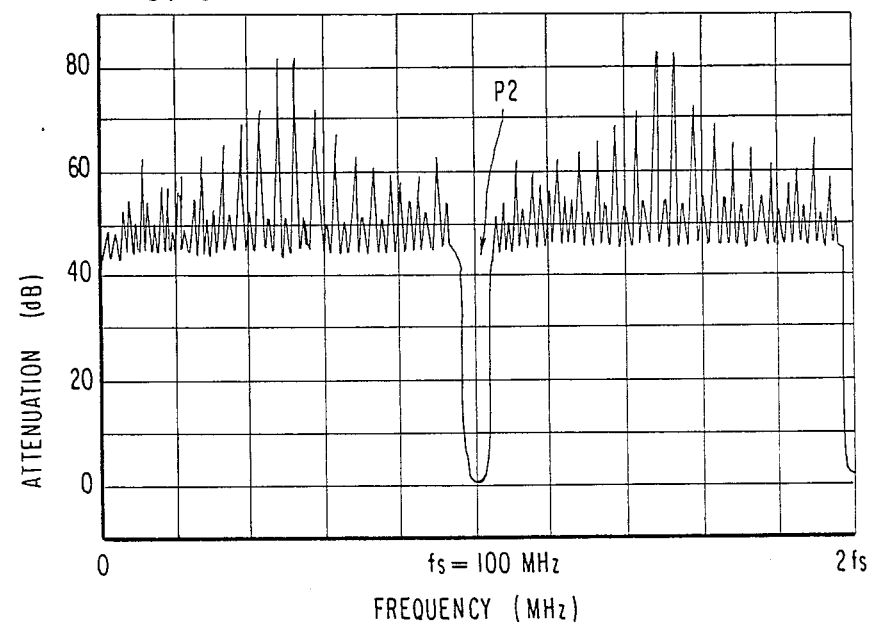

FIG. 9 shows the frequency characteristics of a filter having an electrode pattern comprising the transducers 6 and 7 and the multistrip coupler 9, and FIG. 10, those of a filter having an electrode pattern comprising the transducers 6 and 8 and the multistrip coupler 9. Since the intervals between the electrode fingers and the sampling frequency $f_s$ (=100 MHz) of the transducers 7 and 8 are the same, the center frequencies of the bandpass parts P1 and P2 in the characteristics diagrammed in FIGS. 9 and 10 also are the same.

What is claimed is:

1. A surface acoustic wave (SAW) filter having a piezoelectric substrate and a conductive transducer formed over said piezoelectric substrate, wherein:
    said transducer has first and second bus bars arranged in parallel at a prescribed interval from each other;
    a plurality of pairs of first electrode fingers having the same lengths, vertically extending from said first bus bar and arranged at prescribed intervals in the lengthwise direction of said first bus bar;
    a plurality of pairs of second electrode fingers having the same lengths, vertically extending from said second bus bar, arranged at said prescribed intervals in the lengthwise direction of said second bus bar, the tips of these paired second electrode fingers being positioned opposite to those of said paired first electrode fingers;
    a plurality of first weighted electrode pairs positioned between two adjacent pairs of said first electrode fingers, each pair of said first weighted electrodes comprising a pair of first electrode sections whose lengths of overlap with said paired second electrode fingers are determined by the negative tap coefficients of an FIR filter having a desired lowpass characteristic and a pair of second electrode sections positioned on the elongations of these first electrode sections, one end of each such second electrode section being connected to the first bus bar; and
    a plurality of second weighted electrode pairs positioned between two adjacent pairs of said second electrode fingers, each pair comprising a pair of third electrode sections positioned between two opposite ones of said first electrode pairs, whose lengths of overlap with said paired first electrodes are determined by the positive tap coefficients of said FIR filter, and a pair of fourth electrode sections positioned on the elongations of said electrode sections, one end of each such fourth electrode section being connected to the second bus bar.

2. A surface acoustic wave filter, as claimed in claim 1, wherein said first and second electrode sections of each pair of said first weighted electrodes are apart from each other at a prescribed interval, and the third and fourth electrode sections of each pair of said second weighted electrodes are also apart from each other at said prescribed interval.

3. A surface acoustic wave filter, as claimed in claim 2, wherein said additional transducer comprises a pair of bus bars arranged in parallel at a predetermined interval from each other, a plurality of electrode fingers having equal widths to said electrode fingers of said first and second pairs of electrode fingers, and pairs of floating electrodes arranged at intervals corresponding to said wavelength λ.

4. A surface acoustic wave filter, as claimed in claim 3, wherein said floating electrodes of said additional transducer have a length (Q) which corresponds to a distance between said bus bars of said transducer.

5. A surface acoustic wave filter, as claimed in claim 1, wherein an additional transducer having a normalized electrode pattern constituting a full bandpass filter is arranged over said piezoelectric substrate and in series apart from said transducer.

6. A surface acoustic wave filter, as claimed in claim 1, wherein said prescribed intervals correspond to a wavelength λ of said surface acoustic wave filter, and the width of each of said first and second electrode fingers and each interval between adjacent ones of said electrode fingers corresponds to one eighth λ, wherein $\lambda = 2v/f_s = 2vT$, where v is the phase velocity of the surface acoustic wave, $f_s$ is a sampling frequency of said FIR filter and T is a sampling period of said FIR filter.

7. A surface acoustic wave filter, as claimed in claim 6, wherein said sampling frequency is twice that of said FIR filter.

8. A surface acoustic wave filter, as claimed in claim 1, wherein the lengths of said first and second pairs of electrode fingers are the same.

9. A surface acoustic wave (SAW) filter having a piezoelectric substrate and a conductive transducer set formed over said piezoelectric substrate, wherein:

said transducer set has a first transducer, second and third transducers arranged in parallel to each other, and a multistrip coupler for coupling said first transducer to said second and third transducers;

said first transducer has first and second bus bars arranged in parallel at a prescribed interval from each other;

a plurality of pairs of first electrode fingers having the same lengths, vertically extending from said first bus bar and arranged at prescribed intervals in the lengthwise direction of said first bus bar;

a plurality of pairs of second electrode fingers having the same lengths, vertically extending from said second bus bar, arranged at said prescribed intervals in the lengthwise direction of said second bus bar, the tips of these paired second electrode fingers positioned opposite to those of said paired first electrode fingers;

a plurality of first weighted electrode pairs positioned between two adjacent pairs of said first electrode fingers, each pair of said first weighted electrodes comprising a pair of first electrode sections whose lengths of overlap with said paired second electrode fingers are determined by the negative tap coefficients of an FIR filter having a desired low-pass characteristic and a pair of second electrode sections positioned on the elongations of these first electrode sections, one end of each such second electrode section being connected to the first bus bar;

a plurality of second weighted electrode pairs positioned between two adjacent pairs of said second electrode fingers, each pair comprising a pair of third electrode sections positioned between two opposite ones of said first electrode pairs, whose lengths of overlap with said paired first electrodes are determined by the positive tap coefficients of said FIR filter, and a pair of fourth electrode sections positioned on the elongations of said electrode sections, one end of each such fourth electrode section being connected to the second bus bar;

said second transducer has exactly the same structure as said first transducer; and said third transducers includes electrode fingers having the same width and arranged at the same intervals as the electrode fingers of said first transducer, each such electrode finger being weighted according to the tap coefficient of a bandpass type FIR filter.

10. A surface acoustic wave filter, as claimed in claim 9, wherein said prescribed interval corresponds to a wavelength λ of said surface acoustic wave filter, and the width of each of said first and second electrode fingers and each interval between adjacent ones of said electrode fingers corresponds to one eighth λ, wherein $\lambda = 2v/f_s = 2vT$, where v is the phase velocity of the surface acoustic wave, $f_s$ is a sampling frequency of said FIR filter and T is a sampling period of said FIR filter.

11. A surface acoustic wave filter, as claimed in claim 10, wherein said sampling frequency is twice that of said FIR filter.

12. A surface acoustic wave filter, as claimed in claim 9, wherein the lengths of said first and second pairs of electrode fingers are the same.

13. A surface acoustic wave filter, as claimed in claim 9, wherein an additional transducer having a normalized electrode pattern constituting a full bandpass filter is arranged over said piezoelectric substrate and in series apart from said first transducer, and wherein said additional transducer comprises a pair of bus bars arranged in parallel at a prescribed interval from each other, a plurality of electrode fingers having equal widths to said electrode fingers of said first and second pairs of electrode fingers, and pairs of floating electrodes arranged at intervals corresponding to said wavelength λ.

14. A surface acoustic wave filter, as claimed in claim 13, wherein said floating electrodes of said additional transducer have a length (Q) which corresponds to a distance between said bus bars of said first transducer.

* * * * *

UNITED STATES PATENT AND TRADEMARK OFFICE
CERTIFICATE OF CORRECTION

PATENT NO. : 4,841,265
DATED : June 20, 1989
INVENTOR(S) : Takaya Watanabe et al It is certified that error appears in the above-identified patent and that said Letters Patent is hereby corrected as shown below:

On the title page of the patent, below

"[22] Filed: Sep. 26, 1988", insert the following:

-- [30] Foreign Application Priority Data

Sep. 25, 1987 [JP] Japan.............62-242201
              .............62-242202--

Column 4, line 24, delete "normal red" and insert therefor --normalized--

Signed and Sealed this

Fourth Day of September, 1990

Attest:

HARRY F. MANBECK, JR.

*Attesting Officer*    *Commissioner of Patents and Trademarks*